United States Patent [19]

Solie

[11] Patent Number: 5,831,494
[45] Date of Patent: Nov. 3, 1998

[54] DUAL TRACK LOW-LOSS REFLECTIVE SAW FILTER

[75] Inventor: Leland P. Solie, Apopka, Fla.

[73] Assignee: Sawtek Inc., Orlando, Fla.

[21] Appl. No.: 766,480

[22] Filed: Dec. 12, 1996

[51] Int. Cl.$^6$ ........................................................ H03H 9/64
[52] U.S. Cl. ...................... 333/193; 333/195; 310/313 B; 310/313 D
[58] Field of Search .................................... 333/193–196; 310/313 R, 313 B, 313 C, 313 D

[56] References Cited

U.S. PATENT DOCUMENTS

| | | |
|---|---|---|
| 4,114,116 | 9/1978 | Reeder . |
| 4,162,465 | 7/1979 | Hunsinger et al. . |
| 4,203,082 | 5/1980 | Tsukamoto et al. . |
| 4,316,161 | 2/1982 | Moore et al. . |
| 4,331,840 | 5/1982 | Murphy et al. . |
| 4,600,905 | 7/1986 | Fredericksen . |
| 4,602,228 | 7/1986 | Yamada . |
| 4,609,891 | 9/1986 | Solie et al. . |
| 4,635,008 | 1/1987 | Solie . |
| 4,746,882 | 5/1988 | Solie . |
| 4,749,971 | 6/1988 | Solie . |
| 4,767,198 | 8/1988 | Solie . |
| 4,908,542 | 3/1990 | Solie . |
| 5,075,652 | 12/1991 | Sugai . |
| 5,289,073 | 2/1994 | Mariani ........................... 310/313 B X |
| 5,475,348 | 12/1995 | Hode et al. .......................... 333/194 X |
| 5,646,584 | 7/1997 | Kondratyev et al. ........... 310/313 D X |

OTHER PUBLICATIONS

B.P. Abbott, C.S. Hartmann, and D.C. Malocha, Matching of Single–Phase Unidirectional SAW Transducers and a Demonstration Using a Low–Loss EWC/SPUDT Filter, 1990 Ultrasonics Symposium, pp. 49–54.

*Primary Examiner*—Steven Mottola
*Assistant Examiner*—Barbara Summons
*Attorney, Agent, or Firm*—Allen, Dyer, Doppelt, Milbrath & Gilchrist, P.A.

[57] ABSTRACT

A dual track, low signal loss surface acoustic wave filter includes tapered transducers and tapered reflectors within an axis of propagation for each track to achieve an improved pass band response associated with tapered transducers. The bandwidth of the filter is achieved by adjusting the taper of periodicity normal to the propagation axis. Each track includes reflector gratings mounted on the filter substrate for reflecting a surface acoustic wave propagating from a transducer mounted within each track back to the transducer. Input and output transducers are positioned between the reflectors within each track for providing a direct surface acoustic wave propagation path within the track between the transducers. Alternate parallel tracks have the reflector with an input transducer, and a reflector with an output transducers mounted in an offset alignment with a corresponding adjacent track reflector and transducer for constructively adding surface acoustic wave signals detected within the adjacent track. Both the reflectors and transducers within each track include a similar set of electrode fingers mounted on the substrate generally transverse to the longitudinal propagation axis. In addition, each finger set has adjacent fingers positioned such that a spacing between the adjacent fingers continuously increases or decreases monotonically from point to point transversely to the propagation axis, along the fingers, and the spacing between adjacent fingers along lines parallel to the axis of propagation are substantially equal.

9 Claims, 3 Drawing Sheets

DUAL TRACK LOW-LOSS REFLECTIVE SAW FILTER

BACKGROUND OF INVENTION

1. Field of Invention

The present invention relates generally to a surface acoustic wave (SAW) filter, and more particularly to a filter having tapered transducers and reflectors in a dual track array for reducing filter size and signal distortion.

2. Description of Background Art

Low loss SAW filters are desirable from both the point of low insertion loss and reduced triple transit response (TTS). If a reflective array is used, the die size can be reduced from a given total time delay. When a reflective array is used, the SAW propagates two times the length of the array (from the front of the array to the back edge and then to the front) so that the impulse response is twice as long (in time) as it is for a transducer in which the SAW propagates in only one direction.

U.S. Pat. No. 5,475,348 to Hode et al. discloses a surface wave filter having several channels in parallel exhibiting an inter-transducer gap difference from one channel to the next, so as to cancel the delay line transfer function which corresponds to the direct path between transducers.

As described to the Hode '348 patent, filters of the type whose acoustic path is folded back typically include at least one input and one output transducer, both bi-directional and both placed on a substrate to define a longitudinal path for the surface acoustic wave between the transducers. In addition, reflecting gratings or reflectors are placed on the substrate on either side of the transducers and on the defined longitudinal path or axis of propagation of the surface acoustic waves, such that transduction centers lie on antinodes of a resonate cavity. Depending on the value of electromechanical coupling of the substrate, signal magnification from the cavities is large or small and consequently the relative bandwidth of the device is low or high. Further, the presence of the direct path causes a degradation in the out-of-band rejection whose level is all the higher when it is desired to widen the relative band pass of the filter. Such rejection levels render the filter practically unusable for wide relative bandwidths.

U.S. Pat. No. 4,609,891 to Solie et al. discloses a staggered SAW resonator for Differential Detection comprising at least one pair of resonator channels having reflectors with input and output transducers on the surface of a piezoelectric substrate. One channel of the pair includes an input transducer and an output transducer which are aligned in a path along which a surface acoustic wave progresses. The two channels are identical except for separation distances between the transducers and reflectors, which in one channel is slightly different than in the other. The separation distances within each of the channels determine two slightly different but overlapping frequency passbands which add together so as to broaden the passband for applications which require a passband not achievable with a single channel resonator filter. Differential detection of the SAW is achieved by using a symmetrically inverted output transducer in one embodiment disclosed, and an offset transducer for differentially sensing the SAW, in another embodiment.

Similarly, U.S. Pat. No. 5,475,348 to Hode et al. discloses a SAW filter with longitudinal resonant cavities, wherein the filter comprises an integer number of parallel filtering channels each including a bi-directional input transducer and an output transducer defining a direct path therebetween. In addition, the filter comprises at least two reflecting gratings defining, for each channel, at least one longitudinal resonant cavity. The transmission amplitudes for the channels of the direct paths are described as being the same. The difference in propagation length in the direct path for two consecutive channels is substantially equal to within an integer number of wavelengths at the central filtering frequency, to an Nth of this wavelength, where N is the number of parallel channels. With a result for the central frequency that the vector resultant of the detected signals of the N channels which correspond to the direct paths is practically zero. There is thus practical cancellation of the delay line transfer function outside the stop band of the filter.

Further, tapered transducers used with tapered reflectors are known in the art, as described, by way of example, in U.S. Pat. No. 4,749,971 to Solie, in U.S. Pat. No. 4,767,198 to Solie et al., and in U.S. Pat. No. 5,289,073 to Mariani.

Solie '971 discloses a SAW delay line with multiple reflective taps having a hyperbolically tapered input transducer which directs a SAW to a plurality of hyperbolically tapered partial reflectors. A plurality of hyperbolically tapered output transducer taps are aligned with each of the partial reflectors so that varying delays may be obtained over a wide frequency band. Solie '198 discloses an acoustic signal launched as a SAW by a hyperbolically tapered transducer which wave is then reflected into a bulk acoustic wave (BAW) by a tapered reflector. At each frequency, the tapered reflector must satisfy a phase match condition between the SAW and BAW as defined by their wave vectors. The reflector is designed to reflect the SAW into the BAW at a desired angle. The tapered transducer spatially separates the acoustic signal frequencies and thus avoids forming intermodulation products. In addition, tapered transducers are able to handle higher power levels than other transducers. Therefore, higher acoustic signals can be used. In both the Solie '971, and '198 patents, a reflected SAW signal is directed into a different propagation path than the incoming signal. As a result, the reflected signal does not interact with any signal within the incoming track.

U.S. Pat. No. 5,289,073 to Mariani discloses a unidirectional SAW transducer. The SAW transducer has a plurality of tapered interdigital electrodes that are mounted on a substrate transverse to the SAW propagation axis. The electrode widths and spacings are constant along lines parallel to the axis, and are tapered in the direction transverse to the axis. Reflective fingers are located on the substrate adjacent one of the transducers. The spacings, or gap between fingers, and finger widths of the reflective fingers are similar to those of the electrodes. The finger widths and spacings are tapered in the direction transverse to the axis and are constant along lines parallel to the axis. The tapering permits the fingers to reflect wideband acoustic waves parallel to the axis.

SUMMARY OF INVENTION

In view of the foregoing background, it is therefore an object of the present invention to provide an apparatus and associated method for a low signal loss SAW filter having a desirable shape factor and low ripple pass band response.

This and other objects, advantages and features of the present invention are provided by a filter comprising a piezo-electric substrate and a plurality of filtering tracks on the substrate. Each track comprises first and second reflector means mounted on the substrate for reflecting a surface acoustic wave propagating from a transducer mounted within each track back to the transducer. Each filtering track further includes input and output transducers therebetween, each track input and output transducer mounted within its track and between the track first and second reflector means for providing a direct surface acoustic wave propagation path within the track between the transducers. Alternate parallel tracks further include the first and second reflector means within one track in an offset alignment with a corresponding adjacent track first and second reflector means for constructively adding surface acoustic wave signals detected within the adjacent tracks. The output transducer within one track has a reverse polarity from the output transducer in an adjacent track. The reflector means and transducers within each track include a similar set of electrode fingers mounted on the substrate generally transverse to a longitudinal axis of surface acoustic wave propagation through each track. In addition, each finger set includes adjacent fingers positioned such that a spacing between the adjacent fingers continuously increases or decreases monotonically from point to point transversely to the axis, along the fingers. Further, the spacing between adjacent fingers along lines parallel to the axis of propagation are substantially equal.

BRIEF DESCRIPTION OF DRAWINGS

A preferred embodiment of the invention as well as alternate embodiments are described by way of example with reference to the accompanying drawings in which.

DETAILED DESCRIPTION OF PREFERRED EMBODIMENT

Figure 1:
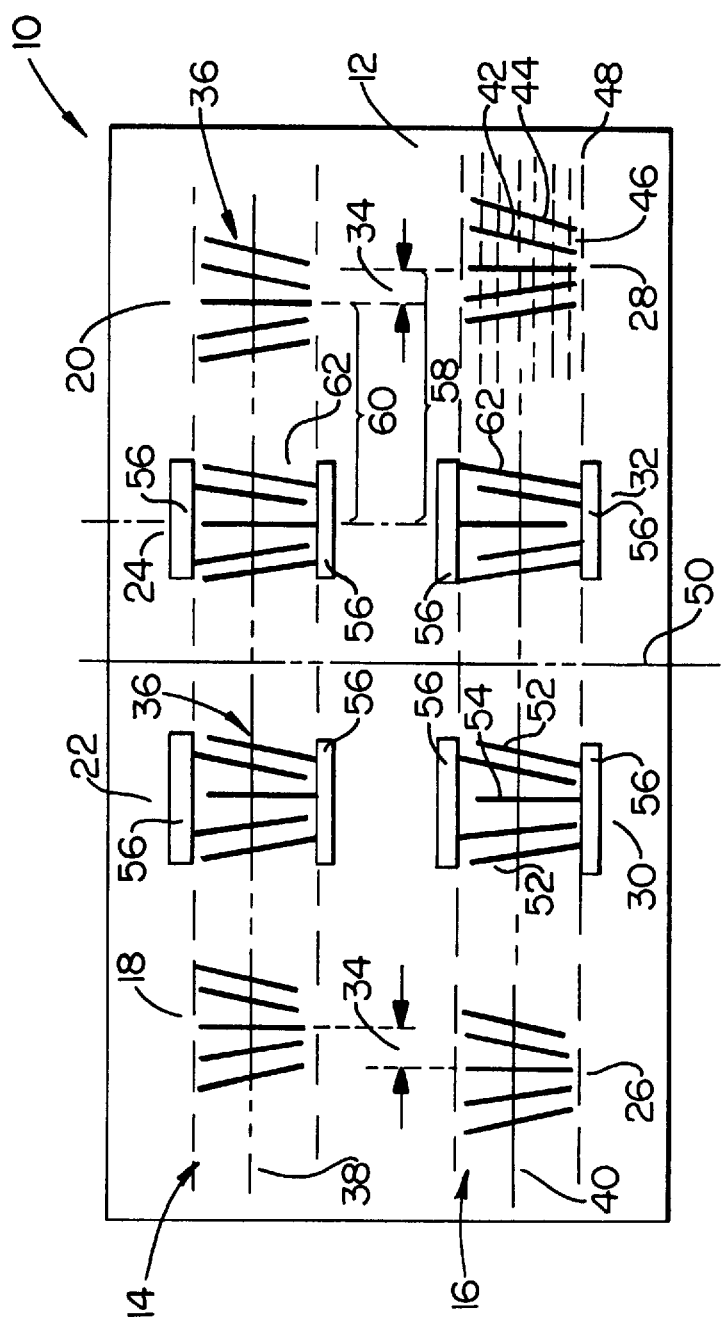
FIG. 1 is a partial diagrammatical plan view of a dual track SAW filter illustrating one preferred embodiment of the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

A preferred embodiment of the present invention, as illustrated with reference to FIG. 1, a dual track SAW filter 10, comprises a piezo-electric substrate 12 upon which first and second filtering tracks 14, 16 are positioned. The first track 14 includes first and second reflector means or reflectors 18, 20 mounted on the substrate 12 for reflecting a surface acoustic wave propagating from a input transducer 22 mounted within the first track 14 and back to the transducer 22, as will be described in further detail later in this section. In addition to the input transducer 22, the first filtering track 14 further includes an output transducer 24. The input transducer 22 and the output transducer 24 are mounted within the first track 14 and between the first track first and second reflector s 18, 20 for providing a direct surface acoustic wave propagation path between the transducers 22, 24.

Similarly, the second filtering track 16 is positioned on the substrate 12 parallel to the first filtering track 14. The second track 16 includes first and second reflector means or reflectors 26, 28 mounted on the substrate 12 for reflecting a surface acoustic wave propagating from an input transducer 30 mounted within the second track 16 back to the transducer 30. The second filtering track 16 further includes an output transducer 32 mounted within the second track 16 and between the second track first and second reflectors 26, 28 for providing a direct surface acoustic wave propagation path between the transducers 30, 32 within the second track 16. The second track reflectors 26, 28 are positioned in an offset alignment 34 with cooperating first track reflectors 18, 20 for constructively adding surface acoustic wave signals detected in each track 14, 16, as will be further described later in this section.

Again with reference to FIG. 1, a preferred embodiment of the present invention, the filter 10 includes the reflectors 18, 20, 26, 28 and transducers 22, 24, 30, 32 within each of the first and second tracks 14, 16, each has an electrode finger set mounted on the substrate 12 transverse to the respective first track and second track longitudinal propagation axes 38, 40 for a surface acoustic wave within the respective first and second tracks 14, 16. Further, each finger set 36 has adjacent fingers 42, 44 positioned such that a spacing 46 between the adjacent fingers 42, 44 continuously increases or decreases monotonically from point to point or from channel to channel 48 transversely along the fingers 42, 44, as illustrated, by way of example, with reference to the numerals identified with the second reflector grating 28 in FIG. 1. The spacing 46 between adjacent fingers along these channels 48 or lines parallel to each propagation axis 38, 40 are substantially equal within a transducer, or within a reflector, but not from a transducer to a reflector.

Again with reference to FIG. 1, the filter 10 in one preferred embodiment has the input transducers 22, 30 and the first reflector gratings 18, 26 symmetrically positioned about a transverse inter-transducer mid-line axis 50 of the filter 10 in such a way that they oppose their respective track output transducers 24, 32 and the second reflectors 20, 28. For the embodiment illustrated, each of the transducers 22, 24, 30, 32 and the reflectors 18, 20, 26, 28 have their fingers 52 mounted on the substrate 12 symmetrically about a central finger 54 respectively within each of the transducers and the reflectors. Further, a polarity change in the output transducer 32 of the second track is provided. As is well known in the art, each transducer will have bus bars 56, unlike the reflectors herein described.

Again with reference to FIG. 1, a separation distance 58, 60 between the first reflectors 18, 26 and their respective input transducers 22, 30, and between the second reflectors 20, 28 and their output transducers 24, 32 is greater than the finger spacing 46 between the electrode fingers within the transducers and reflectors. Further, the separation distance 60 in the first track 14 differs by a quarter wavelength of the filter central frequency from the separation distance 58 of the second track 16 for providing a reflected signal shifted by 180° with respect to a comparable reflection in the parallel track. For the embodiment herein described, the second track distance 58 is greater than the first track distance 60 by $\lambda/4$.

Figure 2:
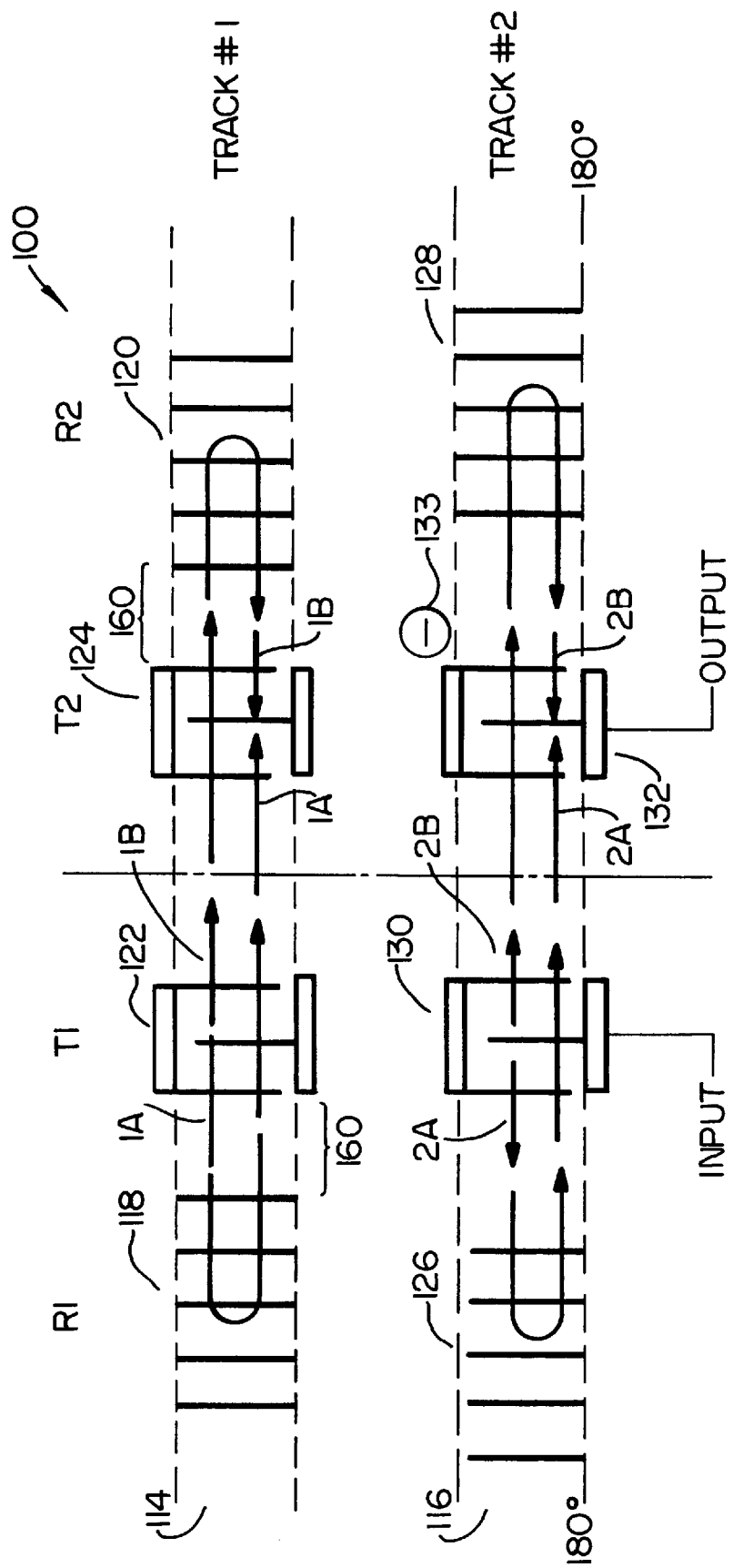
FIG. 2 is a partial diagrammatical plan view of a dual track SAW filter illustrating an embodiment suggested in the art.

For ease in describing surface wave generation and reflections, consider the dual track structure 100 having its operation supported in the earlier cited prior art reference of Solie '891 and Hode '348, illustrated by way of example, with reference to FIG. 2. The upper track is identified as track #1, first track 114 and the lower track as track #2, second track 116. Viewing from left to right, the first element in each track is a reflector designated R1, first tract first reflector 118, second track first reflector 126, and the last is a reflector R2, first track second reflector 120, second track second reflector 128. The two transducers in each track are T1 and T2, and are illustrated with numerals for first track input transducer 122, second track input transducer 130, first track output transducer 124, and second track output transducer 132. The two tracks 114,116 are acoustically isolated from each other, but the transducers 122 to 130, and 124 to 132 are electrically connected.

Figure 3:
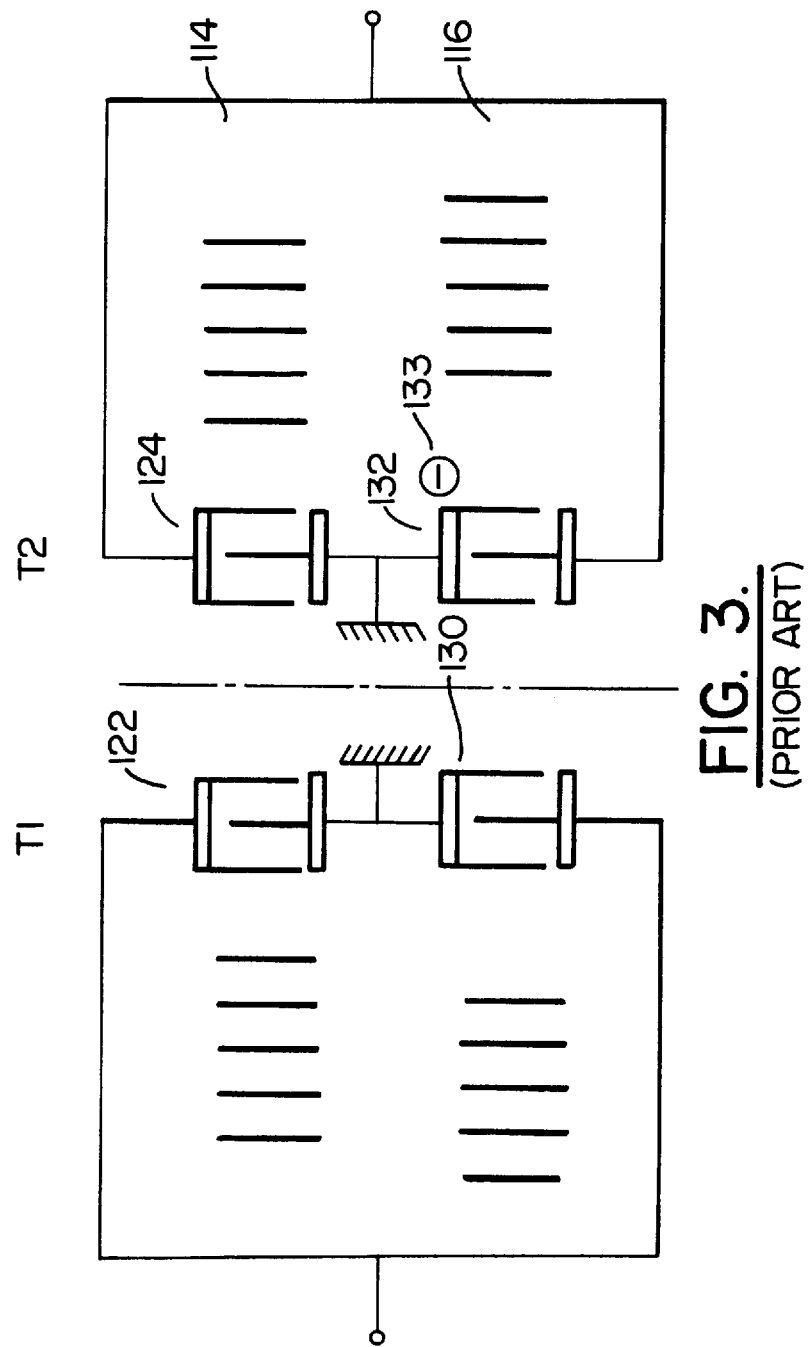
FIG. 3 is the embodiment of FIG. 2 further illustrating one preferred electrical connection.

As illustrated by way of example with reference to FIG. 3, T1 transducers 122, 130 from each track 114,116 are connected together in parallel, as are T2 transducers 124, 132 from each track 114, 116. However, a series connection is also acceptable. The e symbol 133 next to the second track output transducer 132 indicates that T2 second track outout transducer 132 is reversed in polarity with respect to T2 first track output transducer 124. This can be accomplished in several different ways, for example by shifting T2 output transducer 132 in the second track 116 by half a wavelength with respect to T2 output transducer 124 in the first track 114, or by using the same transducer for T1 in tracks #1 and #2, but interchanging the connection to the bus bar for the T2 transducer 132. Again with reference to FIG. 2, the 180° next to R1 and R2 on the second track 116 indicate that the reflectors 126,128 have been shifted by $\lambda/4$ in position such that the reflected signal is shifted 180° with respect to a reflection in first track 114. As described, T1 transducers 122, 130 from both first and second track 114, 116 are connected in parallel as are T2 transducers 124, 132, as earlier described with reference to FIG. 3.

Again with reference to FIG. 2, consider the impulse response in first track 114. By way of example, an impulse signal is generated by T1 transducer 122 and propagates in both directions (left and right). The left signal we will call path 1A (first track 114 and to the left A). The signal originally propagating to the right is 1B. Signal 1A establishes the reference phase. It is launched by T1 transducer 122, reflected by R1 reflector 118 without a phase change, passes through T1 transducer 122(described later in further detail), and received by T2 as the output signal. Signal 1B is launched by T1 transducer 122, passes through T2 transducer 124 (to be discussed later), is reflected by R2 reflector 120 (with no phase change) and is received by T2 transducer 124 as the output signal. Note that 1A arrives at T2 transducer 124 from the left and 1B from the right. The separation distance 160 between R1 reflector 118 and T1 transducer 122 is exactly the same as between T2 transducer 124 and R2 reflector 120, so 1A and 1B have identical propagation delay (phase delay and group delay), thus they add in phase at T2 transducer 124.

Neglecting reflection loss at R1 and R2 reflectors 118, 120 and neglecting propagation loss, all the acoustic energy leaving T1 transducer 122 arrives at T2 transducer 124. There is no bidirectional loss even though both T1 and T2 transducers 124, 122 are bidirectional transducers.

In the second track 116, signal 2A follows the same path as does 1A in first track 114, but the phases are influenced by phases of the reflectors 126, 128 and transducers 130, 132. In 2A, the phase is shifted 180° by R1 reflector 126 and then by another 180° as it is received by T2 transducer 132 for a total phase shift of 360° or 0°. Thus it adds at T2 transducer 132 in phase with the signal at T2 transducer 124 in first track 114. Similarly, 2B is shifted by 180° by R2 reflector 128 and 180° by T2 transducer 132 for a total phase shift of 0°. The important result is that for all four signals 1A, 1B, 2A and 2B that are launched by T1 transducers 122, 130 and are received by T2 transducers 124, 132, and have exactly one reflection, will all have exactly the same phase delay and thus will add constructively at the output. If T1 and T2 transducers 122, 124, 130, 132 are perfectly matched electrically, do not have parasitic resistive loss, and have negligible propagation loss, then the only loss is the reflection loss of a single reflector, which can be a few dB or less.

Such an approach has been suggested in the art using dispersive transducers and reflectors to realize non-dispersive, low-loss bandpass filters. However, such filters suffer from the well known problems encountered when using dispersive filters for bandpass filters. These filters have a poor shape factor and typically unacceptable pass band ripples.

In the present invention, the dual track, low-loss filter 10 is provided with tapered transducers and tapered reflectors as earlier described with reference to FIG. 1, to achieve the same low-loss performance available in the dispersive filter 100 herein described with reference to FIG. 2, but with the shape factor and higher quality pass band response (lower ripple) associated with tapered transducers.

Consider, by way of further example, how other responses that could appear at the output transducers T2 transducers 124, 132 do in fact cancel. Consider 1A and 2A launched from T1 transducers 122, 130 and reflected by R1 reflectors 118, 126. After being reflected by R1 reflectors 118, 126, they are 180° out of phase and so are not detected by T1 transducers 122, 130. The two signals generate exactly opposite voltages at the T1 transducers 122, 130, and are 180° out of phase with each other. The sum, a detected signal at the T1 transducers 122, 130, is identically zero. If they are not detected, they can propagate through the T1 transducers 122,130, as earlier described, as if they were not there. T1 transducers 122, 130 appear transparent to the signals and they pass right on toward the T2 transducers 124,132. Also, signals 1B and 2B launched by the T1 transducers 122, 130 propagate toward the T2 transducers 124, 132. Because the T2 transducer 132 in the second track 116 is 180° out of phase with the T2 transducer 124 in first track 114, the signals 1B and 2B will pass right through the T2 transducers 124, 132 without being detected or reflected. After being reflected by the R2 reflectors 120, 128, the signals 1B and 2B are 180° out of phase and so will be received by the T2 transducers 124, 132 (since they are also 180° out of phase with each other). Thus, the signals 1A, 1B, 2A and 2B will each pass through one transducer as if that transducer were transparent and then be detected by the T2 transducers 124, 132 in phase after propagating identical path lengths.

The operation of the tapered filter 10 as earlier described with reference to FIG. 1 is similar to that described with reference to FIG. 2, except for a tapered transducer and tapered reflector, any single frequency will propagate and/or be reflected by only a limited portion, e.g. a channel 48 of the width of the acoustic aperture 62. The bandwidth of the filter 10 is achieved by the taper of the periodicity normal to the direction of SAW propagation. In the dual track structure 100 described with reference to FIG. 2, the bandwidth is achieved by changing the periodicity in the direction of SAW propagation as with a normal dispersive transducer or reflector.

It is a property of any tapered transducer or reflector that any gap or spacing 46 between electrode fingers 42, 44, by way of example, within the transducers 22, 24, 30, 32 or within the reflectors 18, 20, 26, 28 can be expressed in terms of the wavelength $\lambda_i$ as follows:

$$w_{ij} = m_j \times \lambda_i$$

where $m_j$ is a constant across the j th gap or channel 48 for the entire gap. For a unidirectional transducer, such as described in Mariani '073, this condition is also maintained for the gap between the last electrodes of the transducer and the first electrode of the reflector, the transitional gap.

For the present invention, the gap or spacing 46 is not a constant multiple of $\lambda_i$ across the device but rather differs significantly. It is set by a completely different condition. The group delay for the reflection signal is constant for all frequencies. The center of reflection for the reflector is a straight line normal to the propagation direction. This is clearly not the case for the unidirectional transducer reflector of Mariani '073.

The center of reflection can be defined for each track of the reflector as the weighted average center position of the reflector lines. For the unidirectional transducer, again by way of example with reference to Mariani '073, this center of reflection is approximately the center electrode of the reflector which is a slanted or curved line that is closer to the transducer for the high frequency edge of the reflector.

Again as illustrated with reference to FIG. 2, T1 transducer 122 generates signals 1A and 1B propagating to the left and right, respectively. For a unidirectional transducer, the Mariani '073 device, 1A and 1B must combine in phase after 1A has been reflected by R1 reflector 118. The distance in phase (after a phase reduction by N×360°) for all frequencies across the tapered transducer must be the same for 1A and 1B when they combine. In contrast, in the present invention, 1A and 1B do not combine into a single propagating wave.

The tapered dual track filter 10, herein described with reference to the present invention, provides a needed improvement over the dispersive type filters in that:

1) For the prior art, all frequency components of the SAW must propagate through all components of the dispersive transducer which produces more undesired reflections and distortion of the SAW than in the tapered version. In the present invention, each frequency component of the SAW propagates through regions of the transducer and reflector of essentially the same frequency, thus the tapered configuration will result in signals having less reflection and distortion.

2) For the same transition bandwidth, the length of the dispersive transducer and reflector is several times longer than for the tapered transducer/reflector herein described for the present invention.

Many modifications, including multiple tracks constructed in dual track pairs operating as above described, and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and alternate embodiments are intended to be included within the scope of the appended claims.

What is claimed is:

1. A surface acoustic wave filter comprising:
    a piezo-electric substrate;
    a first filtering track having first and second reflector means mounted on the substrate for reflecting a surface acoustic wave, the first filtering track further having input and output tapered transducers mounted within the first track and between the first track first and second reflector means for providing a direct surface acoustic wave propagation path between the tapered transducers;
    a second filtering track positioned on the substrate parallel to the first filtering track, the second filtering track having first and second reflector means mounted on the substrate for reflecting a surface acoustic wave, the second filtering track further having input and output tapered transducers mounted within the second track and between the second track first and second reflector means for providing a direct surface acoustic wave propagation path between the tapered transducers within the second track, the output tapered transducer within the first track having a polarity 180° out of phase from the output tapered transducer in the second track, the second track reflector means positioned in an offset alignment with the first track reflector means for constructively adding surface acoustic wave signals detected in each track; and
    wherein the reflector means and tapered transducers, within each of the first and second tracks, each have a similar set of electrode fingers mounted on the substrate transverse to a longitudinal axis of propagation for a surface acoustic wave within the respective first and second filtering tracks, each finger set having adjacent electrode fingers positioned such that a spacing between the adjacent fingers continuously changes monotonically from point to point transversely along the fingers, and wherein the spacing between adjacent fingers along lines parallel to the axis of propagation are substantially equal, each of the tapered transducers and the reflector means having their fingers mounted on the substrate symmetrically about a central finger normal to the surface acoustic wave propagation path respectively within each of the transducers and the reflector means.

2. The filter according to claim 1, wherein the input transducers and the first reflector means are generally symmetrically positioned about a transverse inter-transducer mid-line axis of the filter for opposing the output transducers and second reflector means, each within their respective first and second tracks.

3. The filter according to claim 1, wherein a separation distance between center electrode fingers respectively of adjacent transducers and reflector means for each track differs by a quarter of an acoustic wavelength of each frequency, the differing separation distance providing a reflected signal shifted by 180° with respect to a comparable reflection in the parallel track.

4. The filter according to claim 1, wherein a first separation distance between adjacent fingers of the first reflector means and the input transducer, and a second separation distance between the second reflector means and the output transducer is substantially greater than a spacing between the electrode fingers within each of the respective transducers and reflector means.

5. A surface acoustic wave filter comprising:
    a piezo-electric substrate;
    a plurality of filtering tracks wherein each track comprises first and second reflector means mounted on the substrate for reflecting a surface acoustic wave propagating from a transducer mounted within each track back to the transducer, each filtering track further having input and output tapered transducers within its track and between the track first and second reflector means for providing a direct surface acoustic wave propagation path within the track between the transducers, wherein alternate parallel tracks have output transducers of reversed polarity, the alternate parallel tracks further having their respective first and second reflector means mounted in an offset alignment with a corresponding adjacent track first and second reflector means for constructively adding surface acoustic wave signals detected within the adjacent track; and wherein the reflector means and tapered transducers within each of the plurality of filtering tracks include a similar set of electrode fingers mounted on the substrate generally transverse to a longitudinal axis of surface acoustic wave propagation through each of the plurality of filtering tracks, each finger set having adjacent fingers positioned such that a spacing between the adjacent fingers continuously changes monotonically from point to point transversely to the axis, along the fingers, and wherein the spacing between adjacent fingers along lines parallel to the axis of propagation are substantially equal, each of the tapered transducers and the reflector means having their fingers mounted on the substrate symmetrically about a central finger normal to the surface acoustic wave propagation path respectively within each of the tapered transducers and the reflector means.

6. The filter according to claim 5, wherein a first separation distance between adjacent fingers of the first reflector means and the input transducer, and a second separation distance between the second reflector means and the output transducer is substantially greater than a spacing between the electrode fingers within each of the respective transducers and reflector means.

7. The filter according to claim 5, wherein the offset alignment includes a separation distance between center electrode fingers respectively of adjacent transducers and reflector means for each track differs by a quarter wavelength of the filter central frequency, the differing separation distance providing a reflected signal shifted by 180° with respect to a comparable reflection in the adjacent parallel track.

8. The filter according to claim 5, wherein the input transducers and the first reflector means are symmetrically positioned about a transverse intertransducer mid-line axis of the filter for opposing the output transducers and second reflector means, each within their respective tracks.

9. The filter according to claim 5, wherein the plurality of tracks comprises first and second tracks defining a track pair.

* * * * *